US008850275B2

(12) United States Patent
Sakomizu et al.

(10) Patent No.: US 8,850,275 B2
(45) Date of Patent: Sep. 30, 2014

(54) ENCODING APPARATUS, DECODING APPARATUS, AND ENCODING AND DECODING SYSTEM

(75) Inventors: Kazuhito Sakomizu, Shiga (JP); Takashi Nishi, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 323 days.

(21) Appl. No.: 12/929,283

(22) Filed: Jan. 12, 2011

(65) Prior Publication Data

US 2011/0258522 A1 Oct. 20, 2011

(30) Foreign Application Priority Data

Apr. 14, 2010 (JP) ................................. 2010-092962

(51) Int. Cl.
*G06F 11/00* (2006.01)
*G11C 29/00* (2006.01)

(52) U.S. Cl.
USPC ......................................... 714/701; 714/702

(58) Field of Classification Search
USPC ................................................. 714/701, 702
See application file for complete search history.

(56) References Cited

U.S. PATENT DOCUMENTS

| | | | | |
|---|---|---|---|---|
| 6,014,411 A * | 1/2000 | Wang | ............................. | 375/259 |
| 6,202,189 B1 * | 3/2001 | Hinedi et al. | .................. | 714/786 |
| 6,229,824 B1 * | 5/2001 | Marko | ........................... | 370/477 |
| 6,304,991 B1 * | 10/2001 | Rowitch et al. | ............... | 714/755 |
| 6,543,013 B1 * | 4/2003 | Li et al. | ........................... | 714/701 |
| 6,604,216 B1 * | 8/2003 | Javerbring et al. | ........... | 714/751 |
| 6,665,833 B1 * | 12/2003 | Tong et al. | .................... | 714/790 |
| 7,027,518 B2 * | 4/2006 | Mikkola et al. | ............... | 375/259 |
| 7,200,181 B2 * | 4/2007 | Kim et al. | ...................... | 375/262 |
| 7,478,312 B2 * | 1/2009 | Nagase et al. | ................ | 714/790 |
| 7,543,197 B2 * | 6/2009 | Palanki et al. | ................ | 714/701 |
| 7,827,472 B2 * | 11/2010 | Crozier et al. | ................ | 714/790 |
| 8,156,389 B2 * | 4/2012 | Palanki et al. | ................ | 714/701 |

(Continued)

FOREIGN PATENT DOCUMENTS

| | | |
|---|---|---|
| JP | 05-110539 A | 4/1993 |
| JP | 2002-027351 A | 1/2002 |
| JP | 2009-055603 A | 3/2009 |

OTHER PUBLICATIONS

D. Varodayan et al., "Rate-Adaptive Distributed Source Coding Using Low-Density Parity-Check Codes", IN: Proc, Asilomar Conference on Signals, Systems, and Computers, 2005, Pacific Grove, California, Nov. 2005.

(Continued)

*Primary Examiner* — Joseph D Torres
(74) *Attorney, Agent, or Firm* — Rabin & Berdo, P.C.

(57) ABSTRACT

An encoding apparatus derives a bit order based on a puncturing table that specifies different puncturing patterns for different transmission rates. The encoding apparatus then generates an error correcting code from an input information bit string and rearranges the error correcting code in the derived bit order. The error correcting code is punctured by taking a number of consecutive bits from the rearranged error correcting code. The number of bits taken varies depending on the transmission rate. The punctured error correcting code is output to a decoding apparatus, which realigns the code bits according to the transmission rate and the puncturing table, then uses the realigned error correcting code to correct errors in erroneous data. Rearrangement of the error correcting code makes the puncturing process more efficient by avoiding the need to decide whether to take or discard each bit individually.

9 Claims, 7 Drawing Sheets

(56) References Cited

U.S. PATENT DOCUMENTS

| | | | |
|---|---|---|---|
| 8,156,390 B2* | 4/2012 | Palanki et al. | 714/701 |
| 2003/0088821 A1* | 5/2003 | Yokokawa et al. | 714/788 |
| 2006/0156199 A1* | 7/2006 | Palanki et al. | 714/776 |
| 2009/0147724 A1* | 6/2009 | Nimbalker et al. | 370/315 |
| 2009/0254795 A1* | 10/2009 | Palanki et al. | 714/776 |
| 2009/0327843 A1* | 12/2009 | Palanki et al. | 714/776 |
| 2010/0218066 A1 | 8/2010 | Okamura et al. | |

OTHER PUBLICATIONS

Ryoji Hashimoto et al., "Likelihood Estimation for Transform Domain Distributed Video Coding," The Technical Report of the Institute of Image Information and Television Engineers, The General Incorporated Association of the Institute of Image Information and Television Engineers, Feb. 4, 2009, pp. 31-36.

Seishi Takamura, "Distributed Video Coding: Trends and Future," The Research Report of the Information Processing Society of Japan, (The Audio Visual and Multimedia information processing), The General Incorporated Association of Information Processing Society of Japan, Sep. 28, 2006, pp. 71-76.

Debargha Mukherjee, "Parameter Selection for Wyner-Ziv Coding of Laplacian Sources with Additive Laplacian or Gaussian Innovation,", IEEE Transactions on Signal Processing, Aug. 2009, (vol. 57, Issue; 8), pp. 3208-3225.

* cited by examiner

FIG.2
PRIOR ART $$T = \begin{array}{c} \text{COLUMN} \\ \\ \\ \\ \\ \\ \\ \\ \\ \\ \end{array} \begin{array}{c} 1\ 2\ 3\ 4\ 5\ 6\ 7\ 8 \\ \left(\begin{array}{cccccccc} 0 & 0 & 0 & 0 & 0 & 0 & 0 & 0 \\ 0 & 0 & 0 & 0 & 0 & 0 & 0 & 1 \\ 0 & 0 & 0 & 1 & 0 & 0 & 0 & 1 \\ 0 & 0 & 0 & 1 & 0 & 1 & 0 & 1 \\ 0 & 1 & 0 & 1 & 0 & 1 & 0 & 1 \\ 0 & 1 & 0 & 1 & 0 & 1 & 1 & 1 \\ 0 & 1 & 1 & 1 & 0 & 1 & 1 & 1 \\ 0 & 1 & 1 & 1 & 1 & 1 & 1 & 1 \\ 1 & 1 & 1 & 1 & 1 & 1 & 1 & 1 \end{array}\right) \end{array} \leftarrow P(R=3)$$

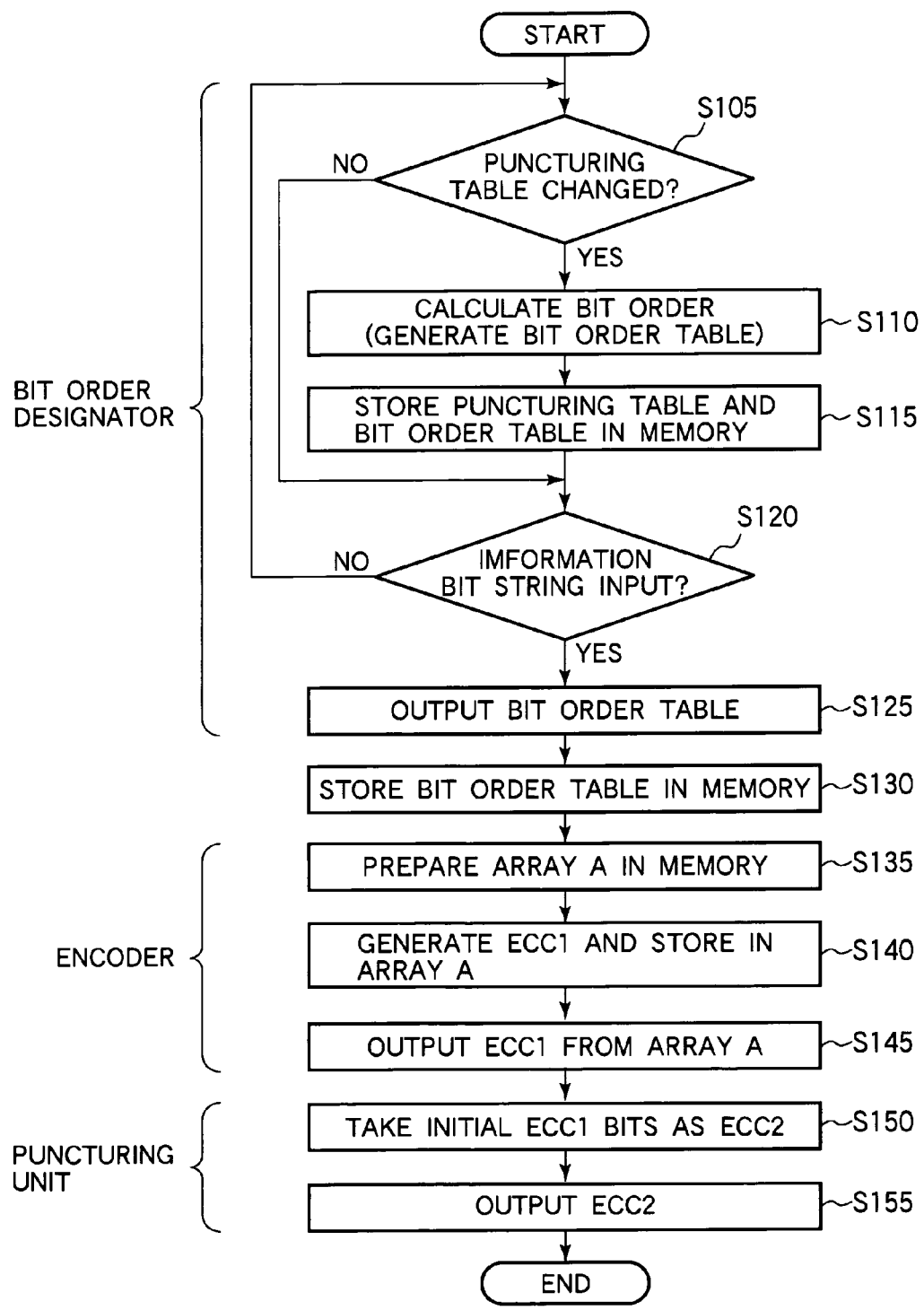

FIG.6A $$T = \begin{bmatrix} 0 & 0 & 0 & 1 \\ 0 & 0 & 1 & 1 \\ 0 & 1 & 1 & 1 \\ 1 & 1 & 1 & 1 \end{bmatrix}$$

FIG.6B $$T = \begin{bmatrix} 0 & 0 & 0 & 1 \\ 0 & 1 & 0 & 1 \\ 0 & 1 & 1 & 1 \\ 1 & 1 & 1 & 1 \end{bmatrix}$$

ENCODING APPARATUS, DECODING APPARATUS, AND ENCODING AND DECODING SYSTEM

BACKGROUND OF THE INVENTION

1. Field of the Invention

The present invention relates to an encoding apparatus for generating and puncturing an error correcting code, to a decoding apparatus for using the punctured error correcting code to correct erroneous data, and to an encoding and decoding system including the encoding apparatus and the decoding apparatus.

2. Description of the Related Art

Encoding and decoding systems are used for video and other image processing. It is sometimes desirable to reduce the computational load on the encoding apparatus, even if the computational load on the decoding apparatus increases. Distributed source coding (DSC), in which the encoding apparatus encodes information from multiple correlated information sources separately and the decoding apparatus decodes the separately encoded data jointly, is a known way to shift the main burden of the computations from the encoding apparatus to the decoding apparatus.

Distributed source coding relies on two theorems. The Slepian-Wolf theorem gives the admissible compression rate region, that is, the set of compression rates that permit the separately encoded data from the multiple information sources to be decoded without distortion. The Wyner-Ziv theorem gives a rate distortion function that applies when distortion occurs at one of the information sources. The compression limit for sources encoded separately, without cross-observation, in the range of the conditions given by the Slepian-Wolf and Wyner-Ziv theorems is known to be the same as the compression limit for the same sources encoded with cross-observation.

A conventional DSC encoding and decoding system 51 including an encoding apparatus 60, a decoding apparatus 70, and a puncturing table storage unit 80 is shown in FIG. 1.

The encoding apparatus 60 sequentially generates an error correcting code Ecc1 from externally input data S1 received from an information source as a string of information bits. The error correcting code Ecc1 is punctured by deleting some of its bits. The remaining code bits, constituting a punctured error correcting code Ecc2, are transmitted to the decoding apparatus 70. The number of bits deleted varies depending on the transmission rate R.

The decoding apparatus 70 uses the punctured error correcting code Ecc2 to correct erroneous data E received from another information source, thereby generating decoded data S2. The erroneous data E may be referred to as side information. In the context of signal processing theory, the side information is similar to data received through a noisy channel. In the context of distributed video coding (DVC), the side information is locally predicted image data.

The puncturing table storage unit 80 stores a puncturing table T that defines puncturing patterns P corresponding to different transmission rates R.

The encoding apparatus 60 includes an encoder 61, a puncturing pattern selector 62, and a puncturing unit 63.

The encoder 61 generates the error correcting code Ecc1 from the externally input information S1 and outputs the error correcting code Ecc1 to the puncturing unit 63.

The puncturing pattern selector 62 selects a puncturing pattern P corresponding to the transmission rate R from the puncturing table T and outputs the puncturing pattern P to the puncturing unit 63. This operation is substantially concurrent with the operation of the encoder 61.

The puncturing unit 63 punctures the error correcting code Ecc1 by deleting bits indicated in the puncturing pattern P, thereby generating the punctured error correcting code Ecc2.

The decoding apparatus 70 includes a decoder 71, which corrects the erroneous data E according to the transmission rate R and punctured error correcting code Ecc2 to generate the decoded data S2.

An exemplary puncturing table T is illustrated as a matrix in FIG. 2. Each horizontal row vector in FIG. 2 represents a puncturing pattern P that is applied to each eight-bit octet of the error correcting code Ecc1. When the transmission rate is R bits per octet, the puncturing pattern selector 62 selects the (R+1)-th row vector. For example, when the transmission rate is three bits per octet, the puncturing unit 63 refers to the fourth row vector.

The puncturing unit 63 deletes the bits in positions corresponding to 0's in the selected puncturing pattern P from the error correcting code Ecc1 generated by the encoder 61, and outputs the bits in positions corresponding to 1's as the punctured error code Ecc2. If the value of the x-th bit of the puncturing pattern P in the (R+1)-th row is denoted T(R+1, x), then the puncturing unit 63 removes the x-th bit of each octet of the error correcting code bit Ecc1 if T(R+1, x)=0, and outputs the x-th bit of each octet if T(R+1, x)=1. The puncturing process thus involves a repeated conditional branching step in which the puncturing unit 63 tests the value of T(R+1, x) to decide what to do with the x-th bit.

The error correcting code used in the encoding and decoding system 51 may be, for example, a low density parity check accumulate code (LDPCA code) or a sum LDPCA code (SLDPCA code) as disclosed by Varodayan et al. in 'Rate-Adaptive Distributed Source Coding Using Low-Density Parity-Check Codes' in *Proc. Asilomar Conference on Signals, Systems, and Computers*, 2005, Pacific Grove, Calif., November 2005. An LDPCA code is generated by accumulating an LDPC code before the puncturing process is carried out. SLDPCA codes are obtained by summing LDPCA codes. Varodayan et al. show that the transmission rate (Mbits/s) of an LDPCA or SLDPCA code can be changed flexibly because, unlike non-accumulated LDPC codes, LDPCA and SLDPCA codes can maintain high decoding performance even when punctured. Turbo codes also have this feature. Transmission rate-flexibility enhances the general usefulness of an encoding and decoding system.

Irregular repeat-accumulate (IRA) codes, which combine iterative codes with interleavers and accumulators, provide high decoding performance, but with less flexibility.

In the conventional encoding and decoding system 51 described above, the puncturing process involves the following computational loads (1) to (3).

(1) Selection of a puncturing pattern P corresponding to the transmission rate R.

(2) Reference to the puncturing pattern P during the puncturing process.

(3) Execution of a separate conditional branching process for each bit of error correcting code Ecc1.

The third of these computational loads increases with the number of Ecc1 bits, and thus with the length of the information bit string. In a distributed video coding system, for example, in which the information bit string may be very long, this becomes a significant obstacle to the goal of lowering the computational load on the encoder.

SUMMARY OF THE INVENTION

An object of the present invention is to provide an efficient method of puncturing an error correcting code.

The invention provides a method of generating a punctured error correcting code at a selectable transmission rate from an input information bit string, and an encoding apparatus employing this method. The method includes:

deriving a bit order based on a puncturing table that specifies different puncturing patterns for different transmission rates;

receiving information designating the transmission rate;

generating an error correcting code from the input information bit string;

rearranging the error correcting code according to the derived bit order;

generating the punctured error correcting code by taking bits from the rearranged error correcting code according to the designated transmission rate; and outputting the punctured error correcting code to a decoding apparatus.

The puncturing table is preferably configured so that the bits taken for output at each transmission rate are also taken for output at all higher transmission rates. This enables the error correcting code to be rearranged so that the punctured error correcting code is obtained simply by taking a number of consecutive bits from one end of the rearranged error correcting code. The puncturing process can then be carried out without the need to test a condition and make a conditional branch at every bit.

The invention also provides a decoding method for using the punctured error correcting code to correct erroneous data, and a decoding apparatus employing this method. The method includes:

receiving the punctured error correcting code and the information designating the transmission rate;

aligning the punctured error correcting code according to the puncturing table and the designated transmission rate to generate a realigned error correcting code; and using the realigned error correcting code to correct the erroneous data according to the designated transmission rate, thereby generating decoded data.

The invention also provides a system including the encoding apparatus, the decoding apparatus, and a puncturing table storage unit for storing the puncturing table.

BRIEF DESCRIPTION OF THE DRAWINGS

In the attached drawings:

FIG. 2 illustrates the puncturing process carried out in the conventional encoding and decoding system;

FIGS. 4A and 4B are flowcharts illustrating the operation of the decoding apparatus in FIG. 3;

FIGS. 6A and 6B illustrate exemplary alterations of a puncturing table.

DETAILED DESCRIPTION OF THE INVENTION

An embodiment of the invention will now be described with reference to the attached drawings.

Figure 3:
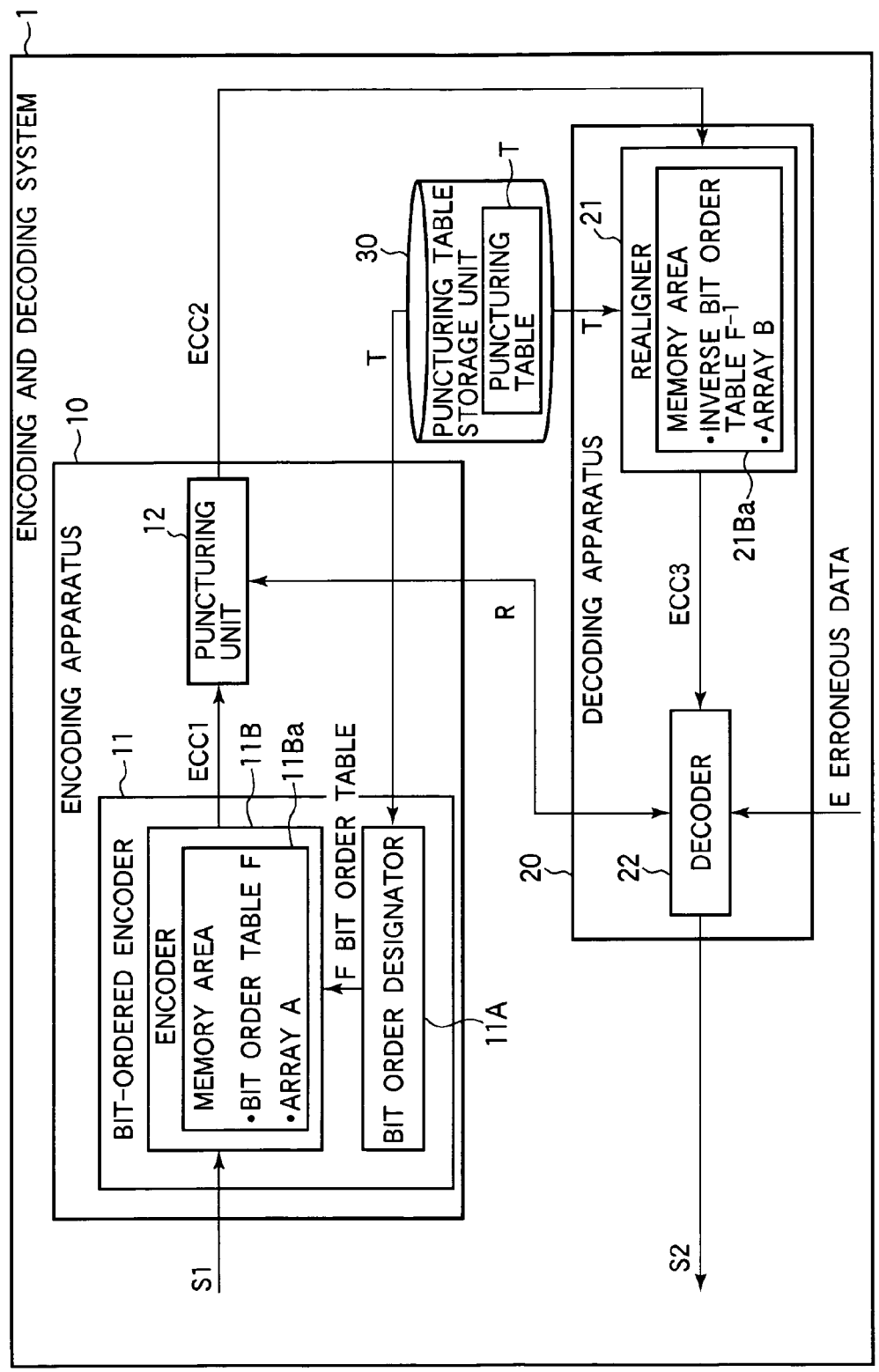
FIG. 3 is a block diagram illustrating the structure of an encoding and decoding system embodying the invention.

Referring to FIG. 3, the embodiment is an encoding and decoding system 1 including an encoding apparatus 10, a decoding apparatus 20, and a puncturing table storage unit 30.

The encoding apparatus 10 sequentially generates an error correcting code ECC1 from an externally input information bit string S1 and outputs some of the ECC1 code bits as a punctured error correcting code ECC2. To generate error correcting code ECC1, it will be assumed below that the encoding apparatus 10 starts by generating a conventional LDPCA code, SLDPCA code, or turbo code equivalent to the error correcting code Ecc1 used in the conventional coding apparatus 61 in FIG. 1. Differing from the conventional encoding apparatus, however, the novel encoding apparatus 10 then rearranges the code bits in a designated order that differs from the normal bit order in an LDPCA, SLDPCA, or turbo code. Error correcting code ECC1 will therefore also be referred to as a rearranged error correcting code.

The encoding apparatus 10 has three input terminals (not explicitly shown) through which it receives the information bits S1, information designating the transmission rate R, and a puncturing table T, and an output terminal (not explicitly shown) from which it outputs the punctured error correcting code ECC2. These terminals are connected to suitable communication channels.

The transmission rate R is designated by the user or the host system that uses the encoding and decoding system 1. The host system may be, for example, a distributed video coding (DVC) system that supplies both the information bit string data S1 and the transmission rate R to the encoding and decoding system 1. The host system may include a computing device that calculates an appropriate transmission rate R.

The encoding apparatus 10 includes a bit-ordered encoder 11 and a puncturing unit 12. As hardware, the bit-ordered encoder 11 and puncturing unit 12 include a read-only memory (ROM) for storing a control program, a central processing unit (CPU) for executing the control program, and random-access memory (RAM) for storing data generated by or used by the CPU. The ROM, CPU, and RAM are not shown in FIG. 3.

As functional blocks, the bit-ordered encoder 11 includes a bit order designator 11A and an encoder 11B.

The bit order designator 11A is connected to the encoder 11B and the puncturing table storage unit 30, and has a memory area (not shown) for storing a copy of the puncturing table T. From the puncturing table T, the bit order designator 11A generates a bit order table F that indicates how to rearrange the error correcting code. The bit order table F represents an integer function that maps the a-th bit position in the normal error correcting code bit order to the b-th bit position in the rearranged order, or the bit position with the b-th index number in the rearranged order, where a and b are integers. In the non-indexed case, this mapping can be expressed as $b=F(a)$.

Figure 1:
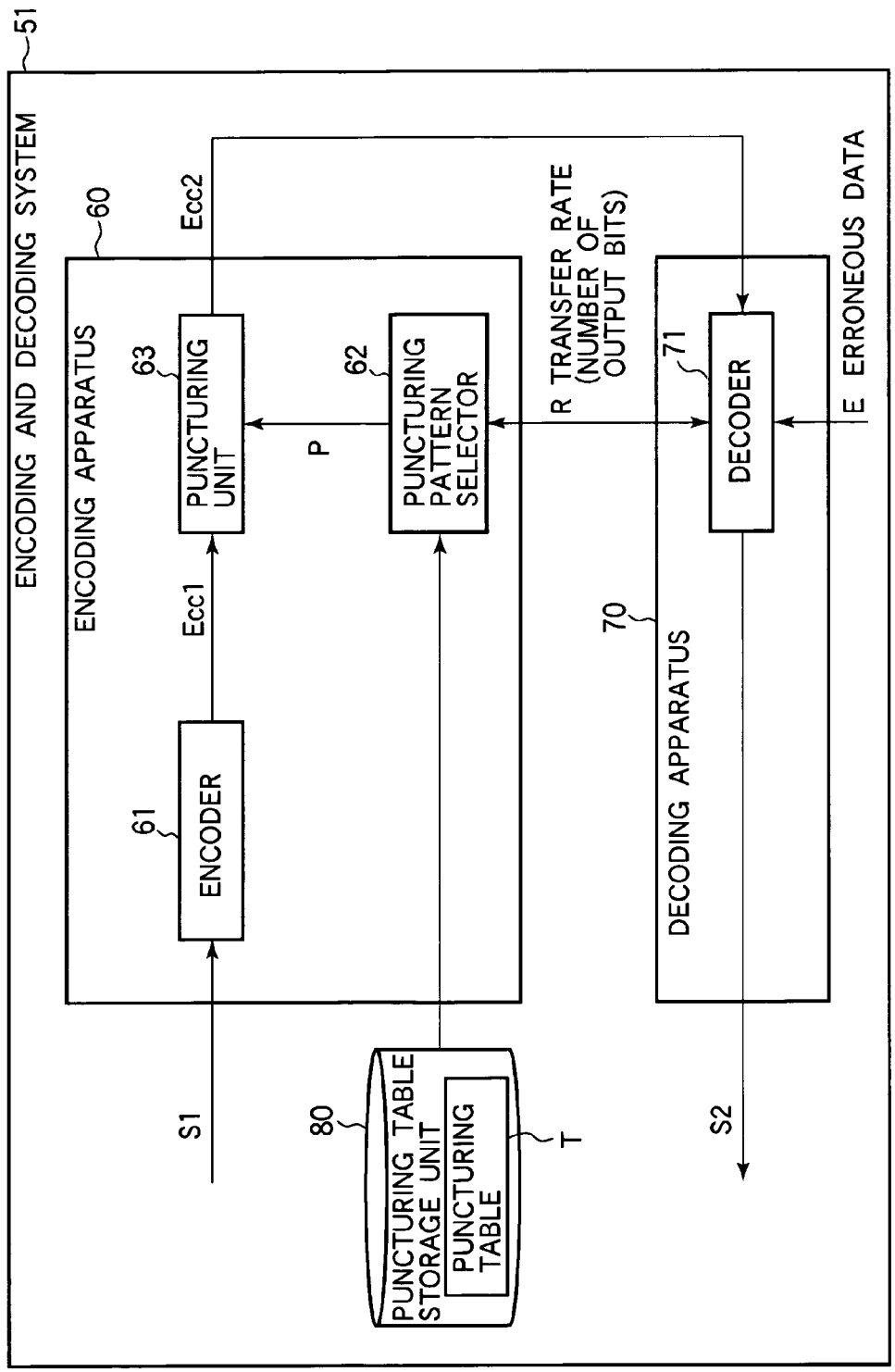
FIG. 1 is a block diagram illustrating the structure of a conventional encoding and decoding system.

The encoder 11B includes a buffer memory area 11Ba that is lacking in the conventional encoder 61 in FIG. 1. After generating a certain number of bits of a conventional error correcting code (an LDPCA, SLDPCA, or turbo code) in the normal order, the encoder 11B stores the value of the x-th bit at a position indexed as $F(x)$ in an array A in memory area 11Ba. The rearranged error correcting code ECC1 is read from the array A in the index order and output to the puncturing unit 12. The array A is large enough to hold at least a number of bits equal to the length of the puncturing patterns in the puncturing table T.

The puncturing unit 12 punctures the rearranged error correcting code ECC1 received from the encoder 11B by taking a number of consecutive bits from the array A. The number of bits taken corresponds to the transmission rate R. The puncturing unit 12 outputs these bits to the decoding apparatus 20 as the punctured error correcting code ECC2. The bits can be taken by, for example, a single shift operation. The following code bits are discarded, until a total number of code bits equal to, for example, the length of the puncturing patterns in the puncturing table T have been taken or discarded. Bits can be discarded by, for example, simply not reading them from the array A.

This process of taking and discarding bits is repeated as further code bits are generated and stored in the array A.

The decoding apparatus 20 includes a realigner 21 and a decoder 22. The decoder 22 is connected to the realigner 21 and to an external device (not shown) that uses the decoded data. As hardware, the realigner 21 and decoder 22 include a CPU, ROM, and RAM (not shown). The realigner 21 stores a copy of the puncturing table T, which it reads from the puncturing table storage unit 30, in a buffer memory area 21Ba in the RAM.

The realigner 21 receives the punctured error correcting code ECC2 from the encoding apparatus 10 and rearranges it according to the stored puncturing table T, thereby generating a realigned error correcting code ECC3. The realigned error correcting code ECC3 is equivalent to the punctured error correcting code Ecc2 used in the conventional encoding and decoding system 51 in FIG. 1.

The decoder 22 receives the realigned error correcting code ECC3 from the realigner 21, receives externally provided information designating the transmission rate R, and uses the received code and information to correct erroneous data E, thereby generating the decoded data S2 output to the decoded data utilization means. The erroneous data E may be conventional side information, and may be corrected by known methods, which will not be described.

In the drawing, the erroneous data E are provided from an external means (not shown), but is also possible for the erroneous data E to be provided by the encoding apparatus 10 itself.

The puncturing table storage unit 30 stores the puncturing table T, which defines the puncturing patterns P corresponding to different transmission rates R. The puncturing table T is structured so that bits selected for output at a given transmission rate are also selected at all higher transmission rates. Thus if R1 and R2 are two transmission rates and R2 is greater than R1 (R2>R1), then all bits selected at transmission rate R1 are also selected at transmission rate R2. The puncturing table storage unit 30 is connected to the bit order designator 11A in the encoding apparatus 10 and the realigner 21 in the decoding apparatus 20 via suitable communication channels.

Figure 4B:
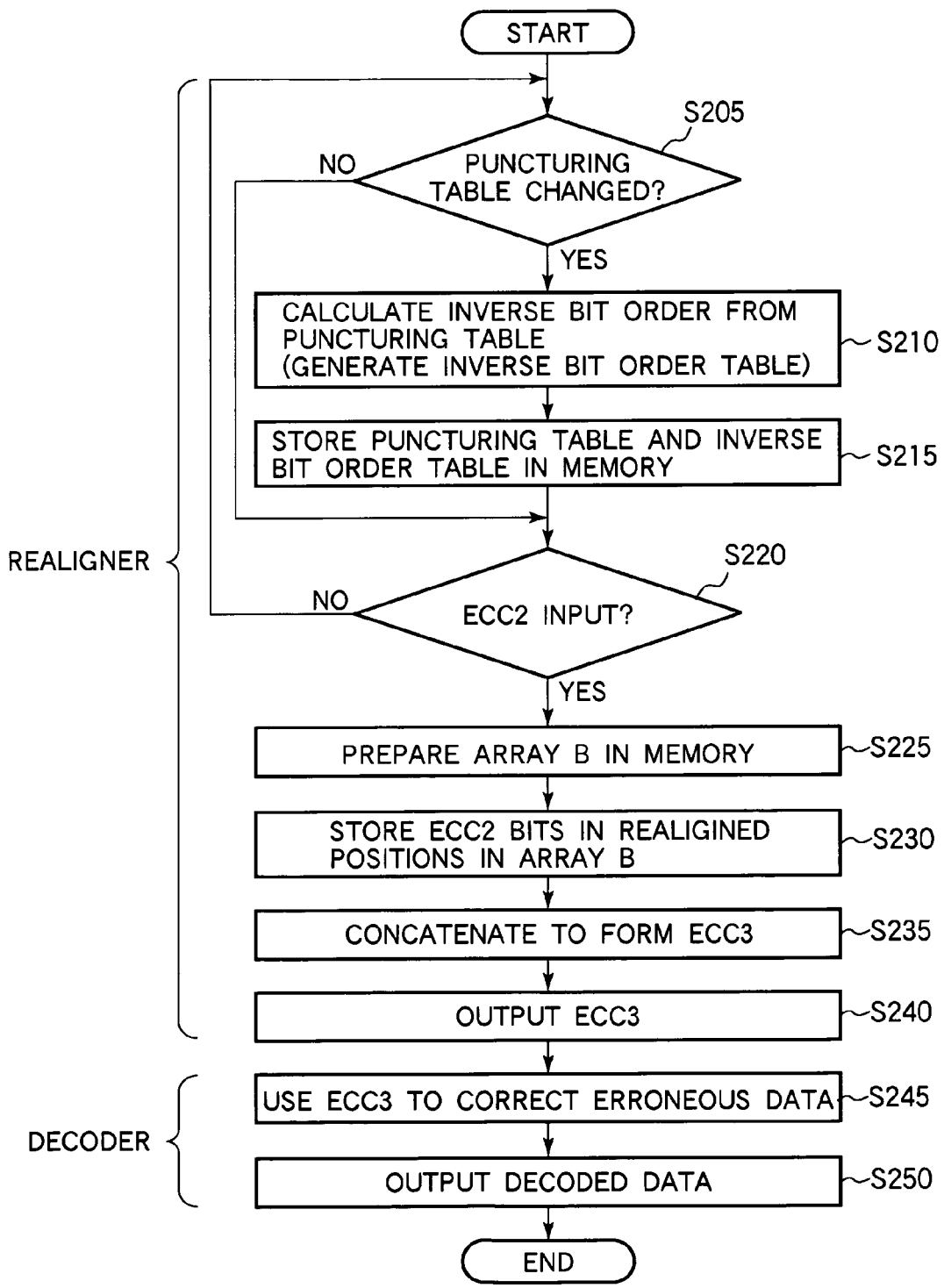

The operation of the encoding and decoding system 1 will now be described with reference to the flowcharts in FIGS. 4A and 4B. The operations shown in these flowcharts are controlled by timers (not shown) in the encoding apparatus 10 and decoding apparatus 20, and by the control programs stored in their ROMs and executed by their CPUs.

Operations for communication between the encoding apparatus 10 and decoding apparatus 20 are omitted from the flowcharts. These operations, which typically include temporary storage of received data in a memory area, reading of the stored data from the memory area as necessary, and output of the data to the appropriate component, are well known in the information processing art.

Also omitted from the flowcharts are the steps by which the transmission rate R is selected and information designating the transmission rate R is supplied to the puncturing unit 12 and decoder 22. These steps may be carried out at any suitable time before or during the puncturing and decoding processes. It will be assumed that the transmission rate R is specified directly as the number of bits taken from the array A in one operation, that is, as the number of 1's in the selected puncturing pattern.

First the operation of encoding apparatus 10 will be described with reference to FIG. 4A.

In step S105, the bit order designator 11A in the encoding apparatus 10 decides whether the puncturing table T has been changed or not. This decision may be made by reading the puncturing table T, or a time stamp thereof, from the puncturing table storage unit 30 and comparing it with the copy stored in the memory area of the bit order designator 11A. Alternatively, the decision may be based on a signal from the host system (not shown) indicating that a change has been made. If the puncturing table T has been changed (Yes), the process proceeds to step S110; otherwise, the process proceeds to step S120.

When it is necessary to distinguish new and old versions of the puncturing table T, the new version will be referred as puncturing table Ta and the old version as puncturing table Tb.

In step S110, the bit order designator 11A generates a new bit order table F from the new puncturing table Ta by a method described later. In step S115, the bit order designator 11A stores the new puncturing table Ta and bit order table F in its memory. The puncturing table Ta and bit order table F are retained in the bit order designator 11A until the puncturing table is changed again and step S105 produces another Yes decision.

After step S115, or after step S105 if the puncturing table T was not changed, in step S120 the bit order designator 11A decides whether a new information bit string S1 has been received. If the decision is Yes, the process proceeds to step S125; otherwise, the process returns to step S105.

In step S125, the bit order designator 11A outputs the bit order table F held in its memory area to the encoder 11B.

On receiving the bit order table F from the bit order designator 11A, the encoder 11B stores it in its memory area in step S130.

Next, in step S135, the encoder 11B prepares the array A for storing the rearranged error correcting code ECC1 in its memory area.

In step S140, the encoder 11B generates the error correcting code from the externally input information bits S1, rearranges the code bits in the bit order designated by the bit order table F, and stores the rearranged error correcting code ECC1 in the array A.

In step S145, the encoder 11B outputs the bit string stored in the array A as the rearranged error correcting code ECC1 to the puncturing unit 12.

In step S150 the puncturing unit 12 receives the rearranged error correcting code ECC1 from the encoder 11B and takes a number of consecutive bits, starting from the first received bit, as the punctured error correcting code ECC2. The number of bits taken is determined by the transmission rate R. The bits are selected in a single operation, without the bit-by-bit testing and conditional branching required in the prior art.

In step S155, the puncturing unit 12 outputs the punctured error correcting code ECC2 to the decoding apparatus 20. This completes the operation of the encoding apparatus 10.

The operation of the decoding apparatus 20 will now be described with reference to FIG. 4B. This operation begins when the decoding apparatus 20 is powered up.

In step S205, the realigner 21 in the decoding apparatus 20 decides whether the puncturing table T has been changed or not. This step is similar to step S105 in FIG. 4 and may be carried out in the same way. If the decision is Yes, the processing proceeds to step S210; otherwise, the processing proceeds to step S220.

In step S210, the realigner 21 calculates the bit order of the rearranged error correcting code ECC1 from the new puncturing table Ta, and generates an inverse bit order table $F^{-1}$ that undoes the rearrangement. If the bit order table F in the encoding apparatus 10 is considered as a substitution or permutation of bit positions, the inverse bit order table $F^{-1}$ is the inverse substitution or permutation. The inverse bit order table $F^{-1}$ can be obtained by calculating the bit order table F, then reversing the roles of table input and table output.

Then, in step S215, the new puncturing table Ta, which resides in the puncturing table storage unit 30, and the inverse bit order table $F^{-1}$ generated in step S210 are stored in a memory area used by the realigner 21. The realigner 21 retains the puncturing table T and inverse bit order table $F^{-1}$ until the puncturing table T is changed again and step S205 produces another Yes decision.

After step S215, or after step S205 if the puncturing table T was not changed, in step S220 the realigner 21 decides whether a new punctured error correcting code ECC2 has been received from the encoding apparatus 10. If the decision is Yes, the process proceeds to step S225; otherwise, the process returns to step S205.

In step S225, the realigner 21 prepares an array B for storing the realigned punctured error correcting code ECC3 in its buffer memory area 21Ba. In step 230, the realigner 21 stores the bit values of the punctured error correcting code ECC2 in the array B in the positions designated by the stored inverse bit order table $F^{-1}$, thereby undoing the rearrangement carried out by the encoding apparatus 10.

After storing all the bit values of the punctured error correcting code ECC2 in the array B, in step S235, the realigner 21 concatenates the bits that it has stored in the array B by closing up the gaps left where no bits were stored, thereby generating the realigned error correcting code ECC3.

In step S240, the realigner 21 outputs the realigned error correcting code ECC3 to the decoder 22.

In step S245, the decoder 22 receives the realigned error correcting code ECC3 from the realigner 21, corrects the erroneous data E on the basis of the realigned error correcting code ECC3 and the transmission rate R, and thereby generates the decoded data S2. The correction process is well known.

In step S250, the decoder 22 outputs the decoded data S2 to complete the operation of the decoding apparatus 20. The output decoded data S2 include only the corrected data and do not include the error correcting code bits.

Figures 5A, 5B:
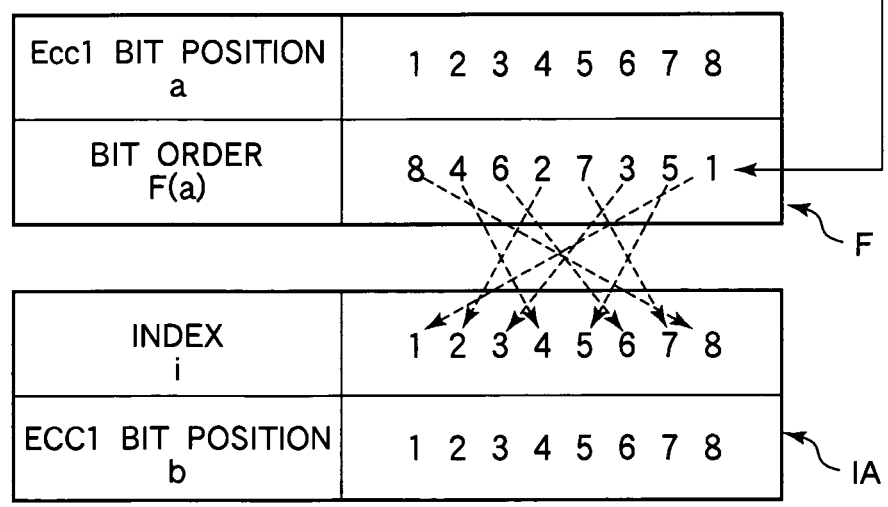
FIGS. 5A and 5B illustrate the puncturing process carried out in the encoding apparatus in FIG. 3.

Next, the puncturing processing in this embodiment will be described in detail with reference to FIGS. 5A and 5B. FIG. 5A shows the same exemplary eight-bit puncturing table T as in FIG. 2, the 0's and 1's indicating positions of code bits to be deleted and output, respectively. FIG. 5B shows the corresponding bit order table F generated by the bit order designator 11A in the encoding apparatus 10, and an index allocation table IA.

To generate the bit order table F, the bit order designator 11A ranks the column vectors in the puncturing table T according to the number if 1's they contain. In the example shown, the eighth column, which has the most 1's, is ranked first, the fourth column, which has the next most 1's, is ranked second, and so on, as indicated by the integers below the table.

The index allocation table IA assigns an order to the bit positions in the rearranged error correcting code ECC1. This order is followed in taking bits from the rearranged error correcting code ECC1 to generate the punctured error correcting code ECC2. In the example shown, index numbers i are simply assigned in the order of the bit positions b. In general, however, the bit positions b may be indexed in any convenient order. For example, the indexing may start at the last bit position in the rearranged error correcting code ECC1.

The bit order table F is constructed by mapping the bit positions a of the conventional error correcting code Ecc1, in order of rank as determined above, to the bit positions b in the rearranged error correcting code ECC1, in order of their index i. The highest ranked Ecc1 bit position a, which has the most 1's in the puncturing table T, is mapped to the ECC1 bit position b with the lowest index i, the second highest ranked Ecc1 bit position is mapped to the ECC1 bit position with the next lowest index, and so on. The mapping is indicated by the arrows in FIG. 5B. If the mapping relationship is represented by the equation b=F(a), then in the example shown, 8=F(1), 4=F(2), 6=F(3), 2=F(4), 7=F(5), 3=F(6), 5=F(7), and 1=F(8).

Since the puncturing table T is structured so that bits selected at a given transmission rate are also selected at all higher transmission rates, for any given transmission rate R, the Ecc1 bit positions a with 1's in the puncturing table T are mapped to the ECC1 bit positions b with the first R index numbers. For example, if the transmission rate R is three bits per octet, corresponding to the fourth row in the table T in FIG. 5A, then the eighth, fourth, and sixth Eccc1 bit positions are mapped to the first three ECC1 bit positions.

After this operation, upon reception of information bits S1, the encoder 11B generates the conventional error correcting code Ecc1 from the information bits S1 but stores the code bit values in the array A in positions given by the bit order table F and the indexing order, and outputs the code bits in the order given by the index values of the bit positions in the array A.

In contrast to the novel encoder 11B, the conventional encoder 61 in FIG. 1 outputs the error correcting code Ecc1 without any rearrangement of its bit positions.

When the puncturing unit 12 punctures the rearranged bit code ECC1, it only has to take the first R bits read from the array A. For example, if the transmission rate is three bits per octet (R=3) and the rearranged error correcting code ECC1 read from array A is '01010101', the puncturing unit 12 simply puts the leading three bits '010' in the punctured error corrected code ECC2, without having to refer to the puncturing table T. If the transmission rate is five bits per octet (R=5), the puncturing unit 12 puts the leading five bits '01010' in the punctured error corrected code ECC2, again without referring to the puncturing table T.

In contrast, when the conventional encoding apparatus 60 in FIG. 1 punctures the conventional error correcting code Ecc1, it must test each bit in the row vector of the puncturing table T to decide whether or not to place each bit of the error correcting code Ecc1 in the punctured error corrected code Ecc2. This process involves many time-consuming conditional branches.

While the present invention eliminates this bit-by-bit conditional branching and selection process, it requires the encoding apparatus 10 to calculate a bit order table F and rearrange the error correcting code bits. The bit order table calculation is necessary, however only when the puncturing table T is altered, and the bit rearrangement process is a simple mapping operation not requiring any bit testing or conditional branching.

An exemplary alteration of a four-bit puncturing table T is illustrated in FIGS. 6A and 6B. FIG. 6A shows the puncturing table T before the alteration; FIG. 6B shows the puncturing table T after the alteration. The alteration interchanges the second and third values in the second row vector in the table.

The alteration of the puncturing table is carried out by the developer or user of the encoding and decoding system 1 when a puncturing table that produces better results is found while the system is being used.

It will be appreciated that a change in the transmission rate R does not change the bit order table F; it only changes the number of bits selected by the puncturing unit 12 after the mapping given by the bit order table F has been applied. Accordingly, the encoding apparatus 10 does not have to recalculate the bit order table F when the transmission rate R is changed.

The realignment process will now be described in more detail.

As described above, in step S210 in FIG. 4B, the realigner 21 generates an inverse bit order table $F^{-1}$ from the puncturing table T, using essentially the same procedure as used by the bit order designator 11A in the encoding apparatus 10 to generate the bit order table F.

Then, upon receiving punctured error correcting code bits from the encoding apparatus 10, the realigner 21 prepares an array B in the memory area. The size of the array may be equal to the length of the puncturing patterns in the puncturing table T. For the puncturing table T shown in FIG. 5A, for example, the realigner 21 may prepare an eight-bit array B.

Next, the realigner 21 stores R bits received in the punctured error correcting code ECC2 in array B, storing the c-th received bit value in the d-th element of array B, where the value of d is obtained from the reversed bit order table $F^{-1}$ by a mapping expressed as $d=F^{-1}$ (c). The bit values of the punctured error correcting code ECC2 are stored in array B so as to maintain this relationship. As the received error correcting code ECC2 has been punctured, there may not be enough received error correcting code bits to fill the array B. Some bit positions in array B will generally be left unoccupied.

After R bits have been stored in array B, the realigner 21 concatenates the R received bits by taking only the bit values of occupied bit positions from the array, skipping unoccupied bit positions. Then the next R received bits are processed in the same way and concatenated with the first R bits. This process continues until all received error code bits have been realigned to generate a new bit string representing the realigned error correcting code ECC3, which matches the conventional punctured error correcting code Ecc2 in FIG. 1. This completes the realignment operation in the decoding apparatus 20.

As described above, the novel encoding and decoding system 1 differs from the conventional encoding and decoding in that the puncturing unit 12 does not have to select a puncturing pattern P corresponding to the transmission rate R from the puncturing table T, refer to the puncturing pattern P while puncturing the code, or perform conditional branching operations for all error correcting code bits. Instead, the puncturing unit 12 only has to take the first R bits stored in an array. This significantly reduces the computational load on the encoding apparatus 10.

The present invention is not limited to the above embodiment. Numerous variations are possible.

For example, the invention is not limited to the use of an LDPCA, SLDPCA, or turbo code. Any code that can be punctured at an adjustable transmission rate R may be used. The error correcting code may be generated by a coding program tailored to the puncturing table T.

The ranking and index orders used in calculating the bit order table F may be reversed, so that bits selected for output only at the highest transmission rate R appear in the bit positions with the lowest index values, and the puncturing unit 12 takes bits from array A in descending order of their index values. If, for example, transmission rate R1 and transmission rate R2 satisfy the relationship R2=(R1+1), then the bit that appears in the pattern for rate R2 but not the pattern for rate R1 will be mapped to a lower-indexed position in array A, and will be read from array A after the bits that appear in pattern R1.

The value of the transmission rate R need not be equal to the number of transmitted bits in the selected puncturing pattern, and this number need not be variable in steps of one bit. When the transmission rate R increases by one, the number of transmitted bits may increase by an arbitrary number of bits, such as eight bits, for example.

The system need not have a shared puncturing table storage unit 30 connected to both the encoding apparatus 10 and decoding apparatus 20 by communication channels. Identical puncturing table storage units 30 may be provided separately in the encoding apparatus 10 and decoding apparatus 20. In this case, however, when the puncturing table is altered, the alteration must be performed in both the encoding apparatus 10 and the decoding apparatus 20.

The index values i of the bit positions in the rearranged error correcting code ECC1 do not have to begin from the leading or trailing end of the rearranged error correcting code ECC1. The appropriate indexing scheme depends on the way in which the bits are read out from the array.

Those skilled in the art will recognize that further variations are possible within the scope of the invention, which is defined in the appended claims.

What is claimed is:

1. An encoding apparatus for generating a punctured error correcting code at a selectable transmission rate from an input information bit string, comprising:
   a bit-ordered encoder for generating an error correcting code from the input information bit string, deriving a bit order based on a puncturing table that specifies different puncturing patterns for different transmission rates, rearranging the error correcting code according to said bit order, and outputting the rearranged error correcting code; and
   a puncturing unit for receiving the rearranged error correcting code and information designating the transmission rate, generating the punctured error correcting code by taking bits from the rearranged error correcting code according to the designated transmission rate, and outputting the punctured error correcting code to a decoding apparatus,
   wherein the bit-ordered encoder further comprises
      a bit order designator for deriving the bit order from the puncturing table; and
      an encoder for generating and rearranging the error correcting code, and
   wherein the bit order designator assigns index values to bit positions in the rearranged error correcting code and assigns bits that are taken at comparatively low transmission rates to bit positions with comparatively low index values, the encoder outputs the rearranged error correcting code in order of the assigned index values, and the puncturing unit takes the bits in consecutive order of their index values, starting from a bit position with a lowest index value.

2. The encoding apparatus of claim 1, wherein the puncturing table is arranged so that bits taken at a given transmission rate are also taken at all higher transmission rates.

3. The encoding apparatus of claim 1, wherein the bit order designator assigns the index values in ascending order from the first bit position to the last bit position in the rearranged error correcting code.

4. The encoding apparatus of claim 1, wherein the bit order designator assigns the index values in ascending order from the last bit position to the first bit position in the rearranged error correcting code.

5. An encoding apparatus for generating a punctured error correcting code at a selectable transmission rate from an input information bit string, comprising:
- a bit-ordered encoder for generating an error correcting code from the input information bit string, deriving a bit order based on a puncturing table that specifies different puncturing patterns for different transmission rates, rearranging the error correcting code according to said bit order, and outputting the rearranged error correcting code; and
- a puncturing unit for receiving the rearranged error correcting code and information designating the transmission rate, generating the punctured error correcting code by taking bits from the rearranged error correcting code according to the designated transmission rate, and outputting the punctured error correcting code to a decoding apparatus,
- wherein the bit-ordered encoder further comprises
    - a bit order designator for deriving the bit order from the puncturing table; and
    - an encoder for generating and rearranging the error correcting code, and
- wherein the bit order designator assigns index values to bit positions in the rearranged error correcting code and assigns bits that are taken only at comparatively high transmission rates to bit positions with comparatively low index values, the encoder outputs the rearranged error correcting code in order of the assigned index values, and the puncturing unit takes the bits in consecutive order of their index values, starting from a bit position with a highest index value.

6. The encoding apparatus of claim 5, wherein the bit order designator assigns the index values in ascending order from the first bit position to the last bit position in the rearranged error correcting code.

7. The encoding apparatus of claim 5, wherein the bit order designator assigns the index values in ascending order from the last bit position to the first bit position in the rearranged error correcting code.

8. An encoding method for generating a punctured error correcting code at a selectable transmission rate from an input information bit string, comprising:
- deriving a bit order from a puncturing table that specifies different puncturing patterns for different transmission rates;
- receiving information designating the transmission rate;
- generating an error correcting code from the input information bit string;
- rearranging the error correcting code according to said bit order;
- assigning index values to bit positions in the rearranged error correcting code;
- assigning bits that are taken at comparatively low transmission rates to bit positions with comparatively low index values;
- outputting the rearranged error correcting code in order of the assigned index values;
- generating the punctured error correcting code by taking bits from the rearranged error correcting code in consecutive order of their index values, starting from a bit position with a lowest index value; and
- outputting the punctured error correcting code to a decoding apparatus.

9. An encoding method for generating a punctured error correcting code at a selectable transmission rate from an input information bit string, comprising:
- deriving a bit order from a puncturing table that specifies different puncturing patterns for different transmission rates;
- receiving information designating the transmission rate;
- generating an error correcting code from the input information bit string;
- rearranging the error correcting code according to said bit order;
- assigning index values to bit positions in the rearranged error correcting code;
- assigning bits that are taken only at comparatively high transmission rates to bit positions with comparatively low index values;
- outputting the rearranged error correcting code in order of the assigned index values;
- generating the punctured error correcting code by taking bits from the rearranged error correcting code in consecutive order of their index values, starting from a bit position with a highest index value; and
- outputting the punctured error correcting code to a decoding apparatus.

* * * * *